United States Patent [19]
Hill

[11] Patent Number: 5,960,303
[45] Date of Patent: Sep. 28, 1999

[54] PROCESS OF FORMING TITANIUM SILICIDE INTERCONNECTS

[75] Inventor: Christopher W. Hill, Boise, Id.

[73] Assignee: Micron Technology, Inc., Boise, Id.

[21] Appl. No.: 08/880,275

[22] Filed: Jun. 23, 1997

[51] Int. Cl.⁶ .................. H01L 21/3205; H01L 21/4763
[52] U.S. Cl. .................. 438/592; 438/655; 438/658; 438/663; 438/682
[58] Field of Search .................. 438/592, 655, 438/658, 663, 682

[56] References Cited

U.S. PATENT DOCUMENTS

| | | | |
|---|---|---|---|
| 5,202,287 | 4/1993 | Joshi et al. | 437/192 |
| 5,236,868 | 8/1993 | Nulman | 437/190 |
| 5,250,467 | 10/1993 | Somekh et al. . | |
| 5,272,666 | 12/1993 | Tsang et al. | 365/96 |
| 5,275,715 | 1/1994 | Tuttle . | |
| 5,360,996 | 11/1994 | Nulman et al. . | |
| 5,365,111 | 11/1994 | Ramaswami et al. . | |
| 5,451,545 | 9/1995 | Ramaswami et al. . | |
| 5,483,104 | 1/1996 | Godinho et al. . | |
| 5,504,038 | 4/1996 | Chien et al. | 437/192 |
| 5,545,592 | 8/1996 | Iacoponi | 437/200 |

*Primary Examiner*—John F. Niebling
*Assistant Examiner*—David A. Zarneke
*Attorney, Agent, or Firm*—Killworth, Gottman, Hagan & Schaeff, LLP

[57] ABSTRACT

A process for forming a titanium silicide interconnect includes applying a layer of polysilicon over a semiconductor layer. A layer of titanium silicide is formed over the layer of polysilicon. The layer of polysilicon and the layer of titanium silicide are etched to form a desired patterned structure. The exposed portions of the layer of titanium silicide are nitrified to form a thin layer of titanium nitride. The titanium nitride encapsulates the titanium silicide thereby improving the chemical and thermal properties of the interconnect.

23 Claims, 6 Drawing Sheets

PROCESS OF FORMING TITANIUM SILICIDE INTERCONNECTS

BACKGROUND OF THE INVENTION

The present invention relates in general to the formation of titanium silicide interconnects, and, more particularly, to a method of forming titanium silicide interconnects having a thin layer of titanium nitride around the titanium silicide.

In the manufacture of integrated circuits used in the construction of dynamic random access memories (DRAMs), static random access memories (SRAMs), and the like, interconnects are required to provide the necessary electrical paths between field effect transistors and other devices fabricated on the semiconductor substrate and the external circuitry used to pass data to and from these devices. Titanium silicide ($TiSi_2$) is commonly used in the formation of such interconnects because of its relatively low resistivity.

Process steps that occur after the deposition and patterning of the $TiSi_2$ can adversely affect the electrical performance of the interconnect. For example, $TiSi_2$ is susceptible to oxidation at high temperatures resulting in the formation of a thin layer of titanium dioxide ($TiO_2$) on the $TiSi_2$. Such $TiO_2$ layers increase the sheet resistance of the interconnect thereby increasing power dissipation and reducing the speed of the device. As used herein, sheet resistance is an electrical quantity measured on a thin layer and has the units of ohms/square. Further, such $TiO_2$ layers make it difficult to form good electrical contacts on the $TiSi_2$ interconnect and pose adhesion problems when subsequent layers are deposited on top of the interconnect line.

The $TiSi_2$ interconnect is also susceptible to grain boundary grooving which increases the resistivity of the interconnect. Grain boundary grooving occurs during high temperature process steps subsequent to the formation of the $TiSi_2$ interconnect which may progress to a discontinuous interconnect and a failed device. Such a condition is known as agglomeration.

Accordingly, there is a need for a method of forming a titanium silicide interconnect which exhibits greater thermal and chemical stability during subsequent processing steps and which does not degrade the electrical properties of the titanium silicide interconnect. Preferably, such a method would be easy to implement and would not entail excess processing steps.

SUMMARY OF THE INVENTION

The present invention meets this need by providing a method for forming a titanium silicide interconnect having a barrier layer of titanium nitride which is formed over the titanium silicide after the interconnect is patterned. According to a first aspect of the present invention, a process of forming a titanium silicide interconnect structure comprises providing at least one semiconductor layer. A patterned structure is formed over the at least one semiconductor layer. The patterned structure comprises a layer of polysilicon and a layer of titanium silicide. A portion of the layer of titanium silicide is nitrified such that a layer of titanium nitride is formed. The layer of titanium nitride may have a thickness in the range of about 50 Angstroms to about 200 Angstroms, and typically, approximately 150 Angstroms. Nitrifying a portion of the layer of titanium silicide such that a layer of titanium nitride is formed comprises nitrifying substantially all of the exposed portions of the layer of titanium silicide such that the layer of titanium nitride is formed on substantially all of the exposed portions of the layer of titanium silicide.

According to another aspect of the present invention, a process of forming a titanium silicide interconnect structure comprises providing at least one semiconductor layer. A patterned structure is formed over the at least one semiconductor layer. The patterned structure comprises a layer of polysilicon, a layer of titanium silicide, and a layer of insulating material. A portion of the layer of titanium silicide is nitrified such that a layer of titanium nitride is formed. The layer of titanium silicide is positioned between the layer of polysilicon and the layer of insulating material such that the layer of titanium silicide comprises at least one exposed side. Nitrifying a portion of the layer of titanium silicide such that a layer of titanium nitride is formed comprises nitrifying the at least one exposed side of the layer of titanium silicide such that a layer of titanium nitride is formed on the at least one exposed side of the layer of titanium silicide.

According to yet another aspect of the present invention, a process of forming a titanium silicide interconnect structure comprises providing at least one semiconductor layer. A patterned structure is formed over the at least one semiconductor layer. The patterned structure comprises a layer of polysilicon and a layer of titanium silicide. The layer of titanium silicide is annealed in the presence of a composition having a reactive nitrogen to convert a portion of the titanium silicide to a layer of titanium nitride having a thickness in the range of about 50 Angstroms to about 200 Angstroms. The layer of titanium silicide is annealed at a temperature ranging from about 500° C. to about 800° C. The composition having a reactive nitrogen is selected from the group consisting of $NH_3$, $N_2H_4$ and a plasma of $N_2$ gas. The patterned structure further comprises a layer of insulating material on the layer of titanium silicide.

According to a further aspect of the present invention, a process of forming a titanium silicide interconnect structure comprises providing at least one semiconductor layer. A layer of polysilicon is formed over the at least one semiconductor layer. The layer of polysilicon has a thickness in the range of about 500 Angstroms to about 1500 Angstroms. A layer of titanium silicide is formed over the layer of polysilicon. The layer of titanium silicide has a thickness in the range of about 1000 Angstroms to about 2000 Angstroms. The layer of titanium silicide and the layer of polysilicon are patterned. A layer of titanium nitride is formed on a portion of the layer of titanium silicide by annealing the layer of titanium silicide in the presence of a composition having a reactive nitrogen. The layer of titanium nitride has a thickness in the range of about 50 Angstroms to about 200 Angstroms.

According to yet another aspect of the present invention, a process of forming an interconnect structure for a field effect transistor having a self-aligned gate comprises providing a substrate assembly having at least one semiconductor layer. A source, a drain and the self-aligned gate of the field effect transistor are formed in the at least one semiconductor layer. A patterned interconnect structure for the self-aligned gate is formed. The patterned interconnect structure comprises a layer of polysilicon and a layer of titanium silicide. A portion of the layer of titanium silicide is nitrified such that a layer of titanium nitride is formed.

According to a further aspect of the present invention, a process of forming a titanium silicide interconnect structure in a memory array comprising a plurality of memory cells arranged in rows and columns with each of the plurality of memory cells comprising at least one field effect transistor comprises providing at least one semiconductor layer. Sources, drains and gates are formed for each of the field effect transistors over the at least one semiconductor layer. A patterned structure for interconnecting desired gates of each of the field effect transistors and other structures formed as part of the memory array is formed. The patterned structure comprises a layer of polysilicon and a layer of titanium silicide. A portion of the layer of titanium silicide is nitrified such that a layer of titanium nitride is formed.

According to another aspect of the present invention, a process of fabricating a wafer comprises providing a wafer having a substrate assembly. The substrate assembly has at least one semiconductor layer. A repeating series of sources, drains and gates for at least one field effect transistor on each of a plurality of individual dies on the wafer is formed over the at least one semiconductor layer. A patterned interconnect structure for each of the field effect transistors is formed on each of the plurality of individual dies on the wafer. The patterned interconnect structure comprises a layer of polysilicon and a layer of titanium silicide. A portion of the layer of titanium silicide is nitrified such that a layer of titanium nitride is formed.

Other features and advantages of the invention will be apparent from the following description, the accompanying drawings and the appended claims.

DETAILED DESCRIPTION OF THE INVENTION

Figure 1:
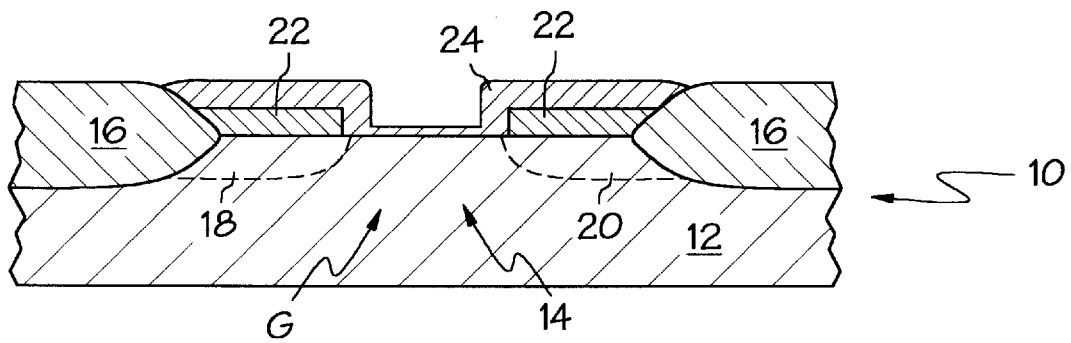
FIGS. 1–3 are enlarged, sectioned side views depicting the formation of a patterned interconnect structure for a MOSFET according to an aspect of the present invention.

Referring now to FIG. 1, a substrate assembly 10 is shown. The substrate assembly 10 comprises a semiconductor layer 12, which is silicon in the illustrated embodiment, and may also include additional layers or structures which define active or operable portions of semiconductor devices (not shown). For example, the semiconductor layer 12 of the substrate assembly 10 may be formed on insulating material, sapphire or another base material. The semiconductor layer 12 is doped with impurities to form a semiconductor of a first/p-type conductivity, or a second/n-type conductivity.

A number of different semiconductor devices may be formed on the semiconductor layer 12. In the illustrated embodiment, a metal oxide semiconductor field effect transistor (MOSFET) 14 having a self-aligned gate is formed. It will be appreciated by those skilled in the art that the term MOSFET is a generic term for any field effect transistor in which a conductive material is formed over the gate insulating material of a field effect transistor. For example, the conductive material may be metallic, conductive polysilicon or a similar conductive material. Polysilicon is typically used as the conductive material with MOSFETs having self-aligned gates to form the contact of the gate. Similarly, titanium silicide is a material commonly used to form an interconnect with polysilicon. While the method of the present invention is described in conjunction with polysilicon as part of the gate structure of a MOSFET having a self-aligned gate, the method is suitable for any interconnect structure comprising polysilicon as part of the contact.

The MOSFET 14 having a self-aligned gate (G) may be formed in accordance with the process described in copending application, U.S. Ser. No. 08/858,772, (Attorney Docket No. MIO 010 PA), A METHOD OF FORMING A FIELD EFFECT TRANSISTOR HAVING A SELF-ALIGNED GATE, filed May 20, 1997, by Donahue et al., herein incorporated by reference. The MOSFET 14 is isolated by a pair of field oxide regions 16 between which a source 18 and a drain 20 are formed. A conductive layer 22 contacts the source 18 and the drain 20 and defines the gate (G) of the MOSFET 14. A gate oxide layer 24 is formed over semiconductor layer 12 and in conjunction with the conductive layer 22 defines the critical dimension for the self-aligned gate (G).

Figure 2:
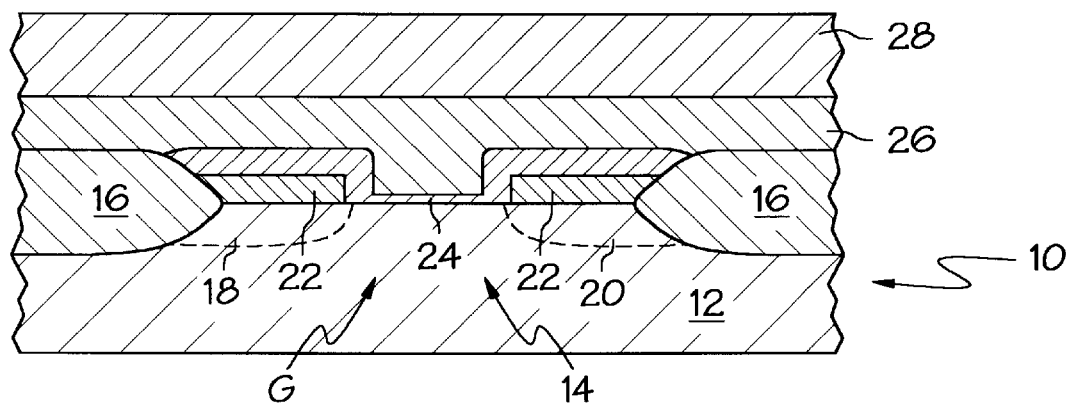

Referring now to FIG. 2, a layer of polysilicon 26 is formed over the semiconductor layer 12 by any conventional deposition technique, such as chemical vapor deposition (CVD) at a temperature ranging from about 600° C. to about 700° C., and typically from about 625° C. to about 650° C., for a predetermined period of time, to a thickness ranging from about 500 Angstroms to about 1500 Angstroms, and preferably about 1000 Angstroms. Silane gas ($SiH_4$) or dichlorosilane ($SiCl_2H_2$) are commonly used in the deposition process. The layer of polysilicon 26 must be doped to increase its conductivity and to also provide a good ohmic contact. Typically, phosphorous in the form of $PH_3$ is used as a dopant due to its high solubility in silicon. The layer of polysilicon 26 may be doped during the polysilicon deposition or after the layer 26 is formed by diffusion or ion implantation.

A layer of titanium silicide 28 is formed over the layer of polysilicon 26 to a thickness ranging from about 1000 Angstroms to about 2000 Angstroms, and preferably about 1500 Angstroms. The layer of titanium silicide 28 is formed using any conventional deposition technique, such as through CVD in which titanium tetrachloride ($TiCl_4$) is combined with $SiH_4$ or $SiCl_2H_2$ at a temperature ranging from about 500° C. to about 900° C., and preferably about 700° C. for a predetermined period of time, or through physical vapor deposition (PVD) in which titanium is sputtered on the layer of polysilicon 26 at a temperature ranging from about 300° C. to about 500° C. for a predetermined period of time. A high temperature anneal in the range of about 500° C. to about 800° C., and preferably about 700°

C. for a predetermined period of time, is performed following deposition of titanium by PVD to cause the titanium to appropriately diffuse into the polysilicon 26, and thus form the layer of titanium silicide 28. The anneal may be performed in an anneal furnace or a rapid thermal processor (RTP). The anneal is performed in an oxygen free environment to prevent the formation of any undesired oxide layer.

Figure 3:
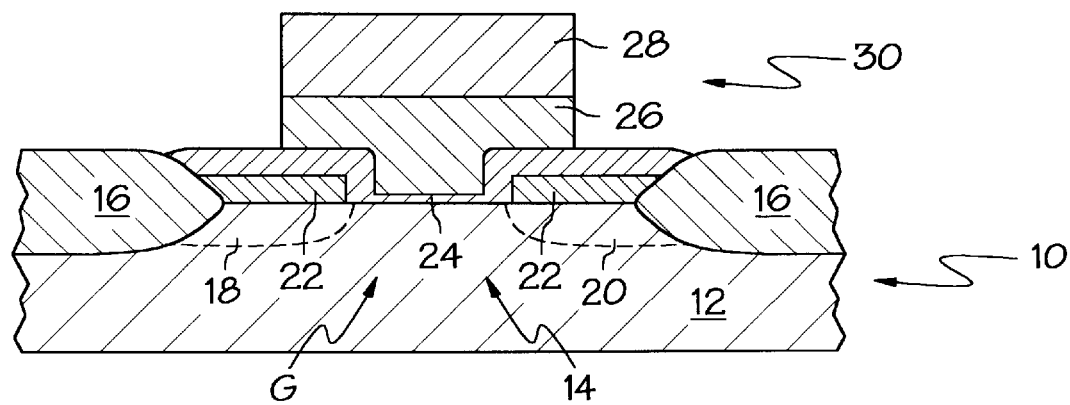
Figure 4:
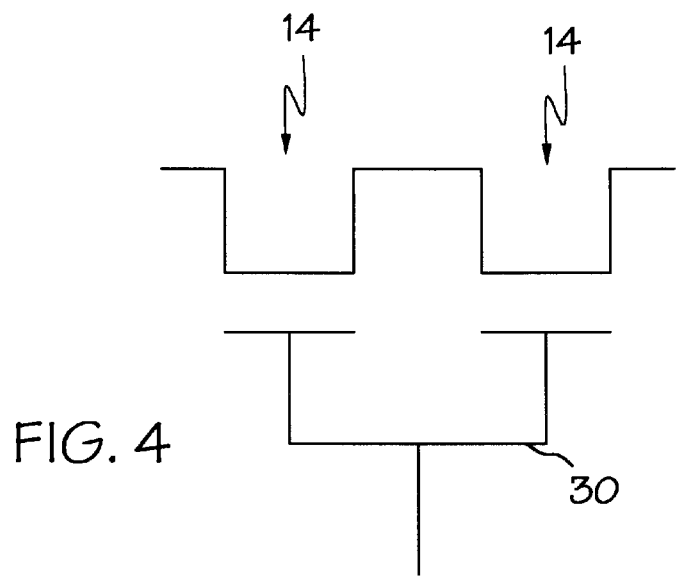
FIG. 4 is a schematic diagram of a pair of MOSFETS having their respective gates interconnected with the patterned interconnect structure of FIG. 3.
Figure 5:
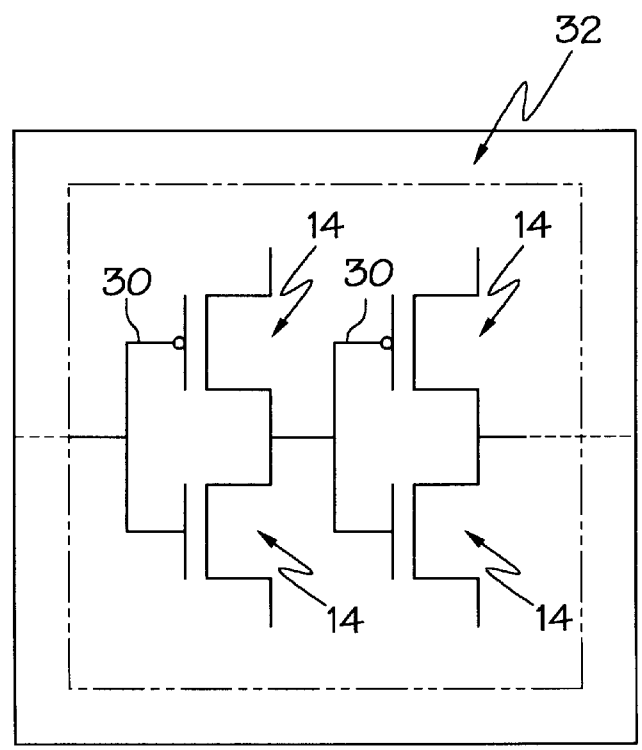
FIG. 5 is a schematic diagram of an integrated circuit with a pair of CMOS invertors interconnected with the patterned interconnect structure of FIG. 3.

Referring now to FIG. 3, the layers of polysilicon 26 and titanium silicide 28 are patterned using standard photolithographic masking and etching to form a patterned structure 30. The patterned structure 30 may take the form of a gate structure for the transistor 14, a local interconnect for connecting the gates of two or more transistors 14, shown schematically in FIG. 4, or as an interconnect for connecting the gates of a plurality of transistors 14 in an integrated circuit 32, shown schematically in FIG. 5.

Figure 6:
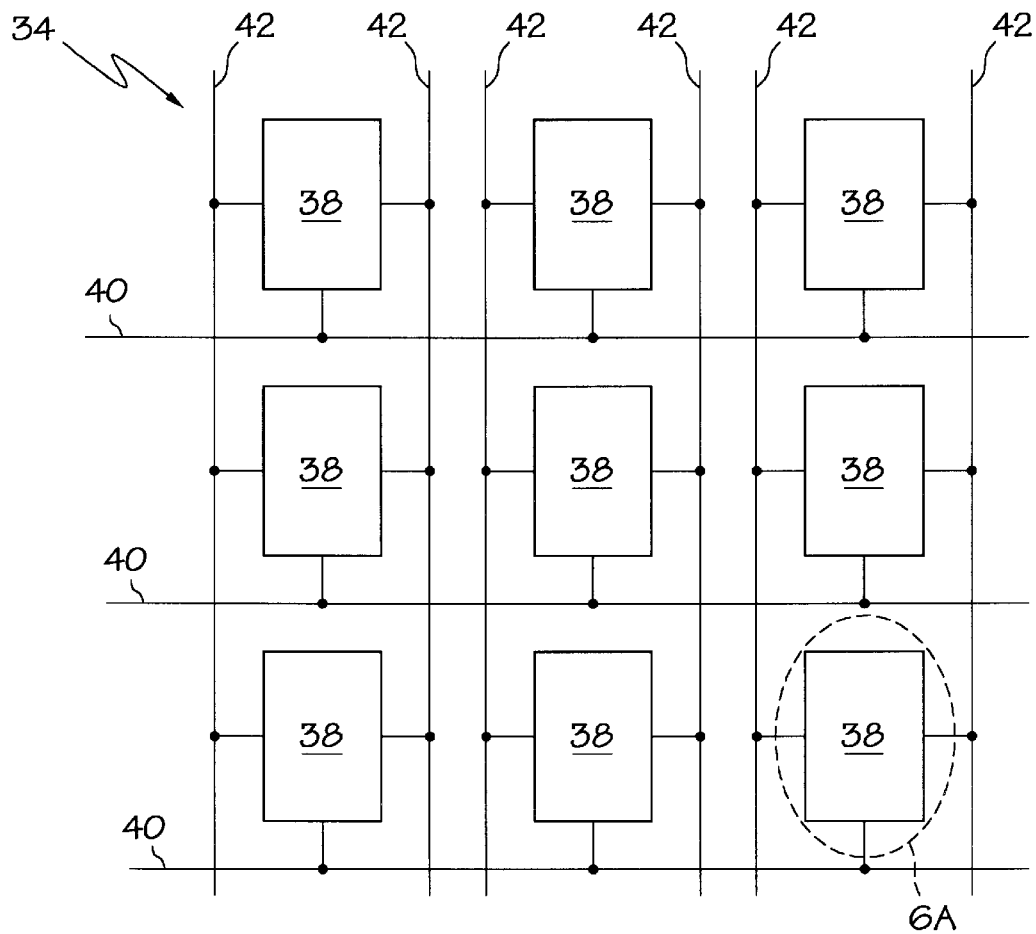
FIG. 6 is a schematic diagram of an SRAM array having a plurality of memory cells arranged in rows and columns.
Figure 6A:
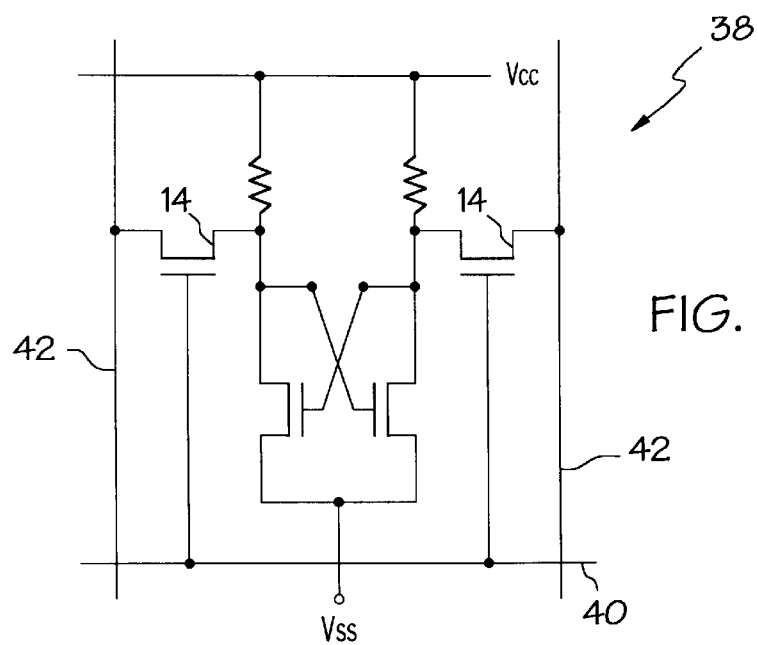
FIG. 6A is a schematic diagram of a representative memory cell of the SRAM array of FIG. 6 with the patterned interconnect structure of FIG. 3.
Figure 7:
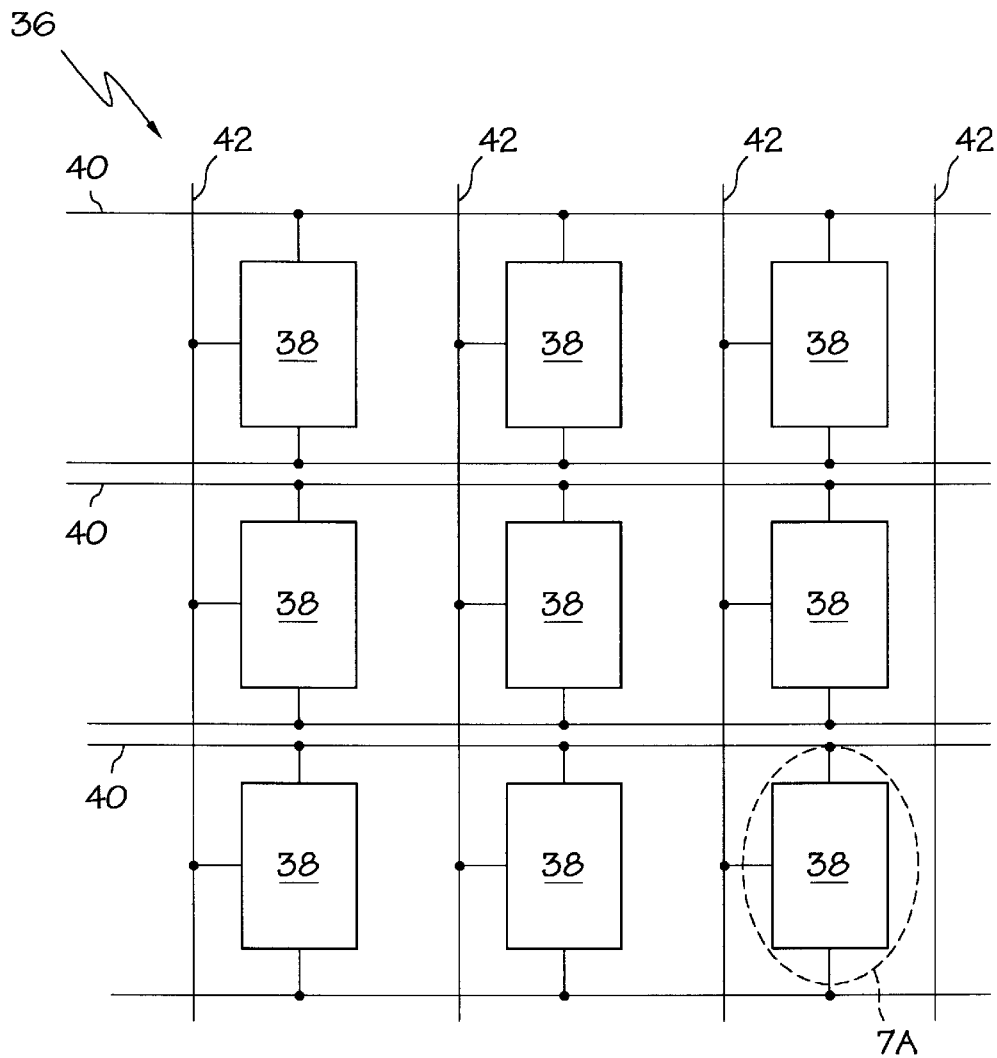
FIG. 7 is a schematic diagram of a DRAM array having a plurality of memory cells arranged in rows and columns.
Figure 7A:
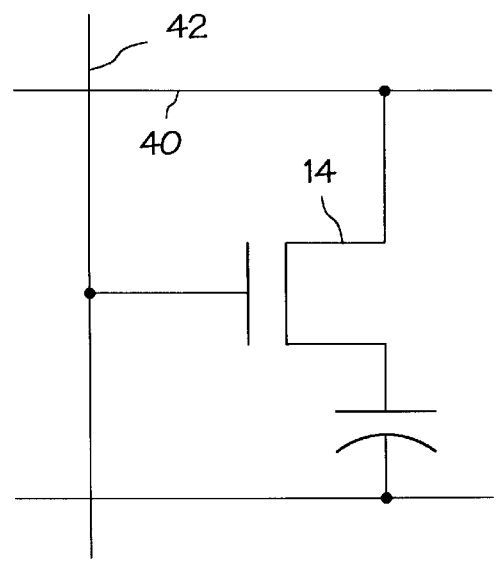
FIG. 7A is a schematic diagram of a representative memory cell of the DRAM array of FIG. 7 with the patterned interconnect structure of FIG. 3.
Figure 8:
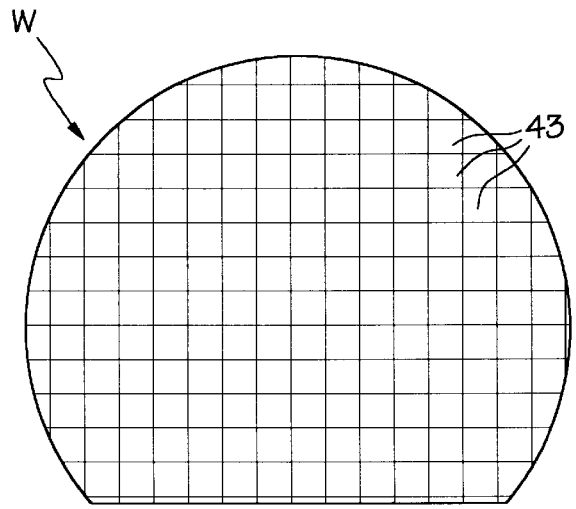
FIG. 8 is a top view of a wafer having the patterned interconnect structure of FIG. 3.

The patterned structure 30 may also be used in a typical static random access memory (SRAM) array 34 or in a typical dynamic random access memory (DRAM) array 36, as shown in FIGS. 6 and 7. The SRAM array 34 and the DRAM array 36 comprise a plurality of memory cells 38 arranged in rows and columns. Each of the memory cells 38 also comprise at least one transistor 14. As shown in FIG. 6A, each of the memory cells 38 of the SRAM array 34 comprise a pair of access transistors 14, the gates of which are coupled to a respective row line 40 via the patterned structure 30 of FIG. 3. Similarly, as shown in FIG. 7A, each of the memory cells 38 of the DRAM array 36 comprise a switch transistor 14, the gate of which is coupled to a respective word line 42 via the patterned structure 30 of FIG. 3. It should be apparent that the configuration of the patterned structure 30 is dependent, in part, on the desired interconnection of the gates of the transistors 14 as well as the interconnection of the sources and drains of the transistors 14. It should also be apparent that other devices within the integrated circuit 32, the SRAM array 34 and the DRAM array 36, such as external contacts, other FET transistors, bipolar transistors, resistors, capacitors, and the like, may be interconnected via the patterned structure 30. The patterned structure 30 may also be used in the fabrication of a wafer W as shown in FIG. 8. The wafer W includes a plurality of individual dies 43. Wafer masks (not shown) are used to apply a desired circuit structure on each of the individual dies 43. The desired circuit structure may comprise any of the above described structures, i.e. the integrated circuit 32, the SRAM array 34 or the DRAM array 36, with the appropriate patterned structure 30. The wafer W is processed using standard wafer fabrication techniques.

Figure 9:
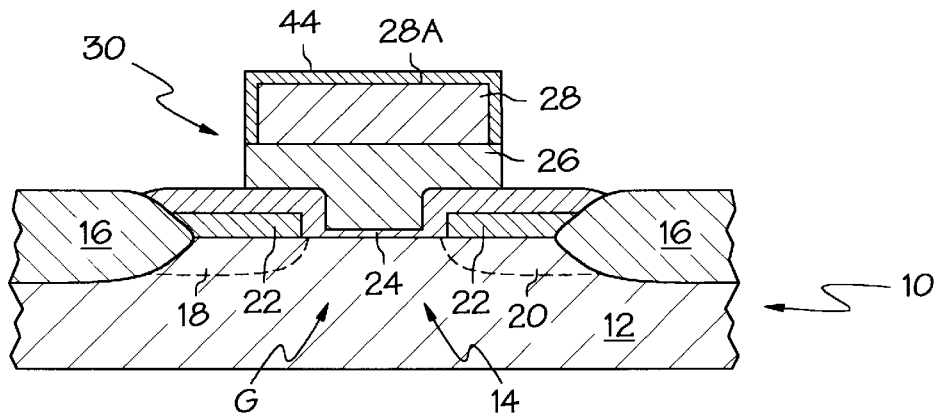
FIG. 9 is an enlarged, sectioned side view depicting the formation of a nitride layer encapsulating a portion of the patterned interconnect structure of FIG. 3.

Referring now to FIG. 9, an outer or exposed portion 28A of the layer of titanium silicide 28 is nitrified to form a layer of titanium nitride 44 to a thickness ranging from about 50 Angstroms to about 200 Angstroms, and preferably about 150 Angstroms. The layer of titanium nitride 44 is formed by exposing the patterned structure 30 to a composition of reactive ambient of nitrogen, such as ammonia ($NH_3$), hydrazine ($N_2H_4$) or a plasma of nitrogen gas ($N_2$), at a temperature ranging from about 500° C. to about 800° C., and preferably about 650° C., for a predetermined period of time. This high temperature reaction may be performed in an annealing furnace or a RTP. The environment must also be oxygen-free to prevent the formation of an undesired oxide layer.

The layer of titanium nitride 44 encapsulates the layer of titanium silicide 28 and increases the chemical and thermal stability of the patterned structure 30. Titanium nitride is more stable than titanium silicide and does not readily oxidize. The layer of titanium nitride provides an effective chemical barrier to prevent the diffusion of oxygen and other elements across the titanium nitride/titanium silicide interface. Titanium nitride also has a relatively low resistance and does not adversely affect the conductivity of the patterned structure/interconnect 30. The layer of titanium nitride 44 also increases the thermal stability of the patterned structure 30 making the layer of titanium silicide 28 more resistant to agglomeration. This improvement in thermal stability is attributed to changes in interfacial free energy and to the inhibition of surface diffusion. As the layer of titanium silicide 28 is nitrified after it is patterned, substantially all of the exposed surfaces of the titanium silicide layer 28 are encapsulated by the titanium nitride layer 44.

Figure 10:
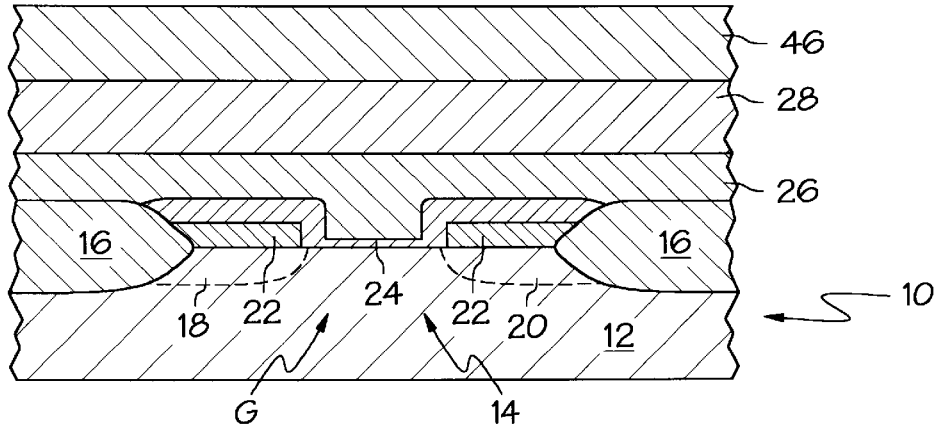
FIGS. 10 and 11 are enlarged, sectioned side views depicting the formation of a patterned interconnect structure for a MOSFET according to an another aspect of the present invention.
Figure 11:
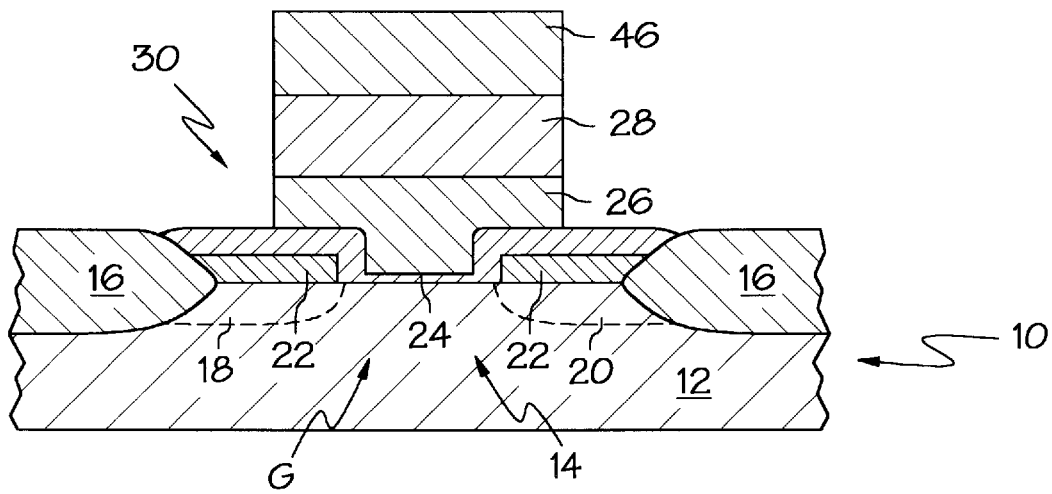
Figure 12:
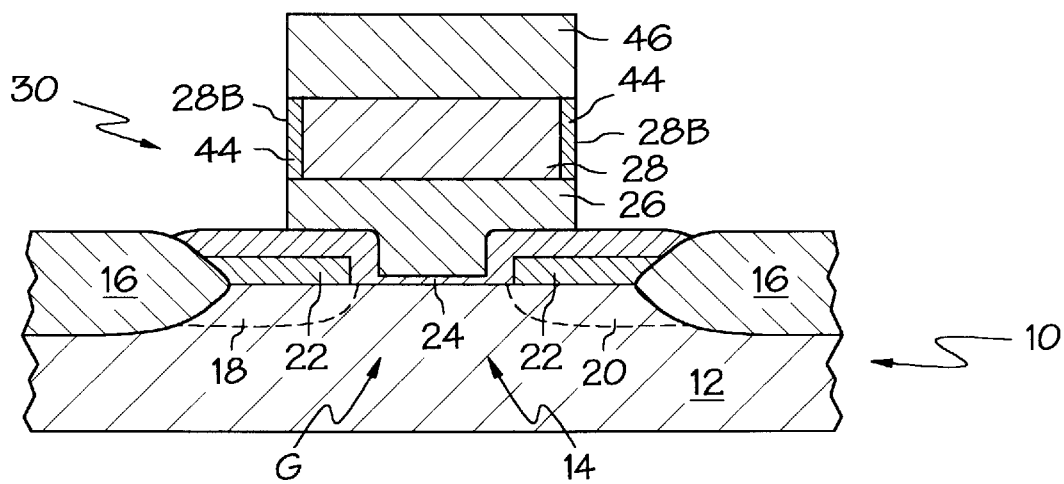
FIG. 12 is an enlarged, sectioned side view depicting the formation of a nitride layer encapsulating a portion of the patterned interconnect structure of FIG. 11.

According to another embodiment of the present invention, an insulating layer 46 is formed over the layer of titanium silicide 28, as shown in FIG. 10, to increase the eventual height of the patterned structure 30. The insulating layer 46 may comprise titanium dioxide, silicon dioxide insulation material, boron glass, phosphorus glass, boron/phosphorus glass, or any other material which is an insulator. The thickness of the insulating layer 46 is dependent on the desired height of the patterned structure 30. Once the insulating layer 46 is formed over the layer of titanium silicide 28, the layer of polysilicon 26, the layer of titanium silicide 28, and the insulating layer 46 are patterned using standard photolithographic masking and etching to form the patterned structure 30 as shown in FIG. 11. Referring now to FIG. 12, the exposed sides 28B of the layer of titanium silicide 28 are nitrified to form the layer of titanium nitride 44 in the same manner as described above. The layer of titanium nitride 44 encapsulates the exposed sides 28B of the layer of titanium silicide 28, thereby increasing the chemical and thermal stability of the patterned structure 30 in the same manner as described above.

Having described the invention in detail and by reference to preferred embodiments thereof, it will be apparent that modifications and variations are possible without departing from the scope of the invention which is defined in the appended claims.

What is claimed is:

1. A process of forming a titanium silicide interconnect structure comprising:

providing at least one semiconductor layer;

forming a patterned structure over said at least one semiconductor layer, said patterned structure comprising a layer of polysilicon and a layer of titanium silicide; and nitrifying a portion of said layer of titanium suicide such that a layer of titanium nitride and said titanium silicide interconnect structure are formed.

2. The process of claim 1, wherein said layer of titanium nitride has a thickness in the range of about 50 Angstroms to about 200 Angstroms.

3. The process of claim 2, wherein said layer of titanium nitride has a thickness of approximately 150 Angstroms.

4. The process of claim 1, wherein nitrifying a portion of said layer of titanium silicide such that a layer of titanium nitride is formed comprises nitrifying substantially all of the exposed portions of said layer of titanium silicide such that said layer of titanium nitride is formed on substantially all of said exposed portions of said layer of titanium silicide.

5. A process of forming a titanium silicide interconnect structure comprising:

providing at least one semiconductor layer;

forming a patterned structure over said at least one semiconductor layer, said patterned structure comprising a layer of polysilicon, a layer of titanium silicide, and a layer of insulating material; and nitrifying a portion of said layer of titanium silicide such that a layer of titanium nitride and said titanium silicide interconnect structure are formed.

6. The process of claim 5, wherein said layer of titanium silicide is positioned between said layer of polysilicon and said layer of insulating material such that said layer of titanium silicide comprises at least one exposed side, and wherein nitrifying a portion of said layer of titanium silicide such that a layer of titanium nitride is formed comprises nitrifying said at least one exposed side of said layer of titanium silicide such that a layer of titanium nitride is formed on said at least one exposed side of said layer of titanium silicide.

7. A process of forming a titanium silicide interconnect structure comprising:

providing at least one semiconductor layer;

forming a patterned structure over said at least one semiconductor layer, said patterned structure comprising a layer of polysilicon and a layer of titanium silicide;

annealing said layer of titanium silicide in the presence of a composition having a reactive nitrogen to convert a portion of said titanium silicide to a layer of titanium nitride and thereby form said titanium silicide interconnect structure, said layer of titanium nitride having a thickness in the range of about 50 Angstroms to about 200 Angstroms.

8. The process of claim 7, wherein annealing said layer of titanium silicide is carried out at a temperature ranging from about 500° C. to about 800° C.

9. The process of claim 7, wherein said composition having a reactive nitrogen is selected from the group consisting of $NH_3$, $N_2H_4$ and a plasma of $N_2$ gas.

10. The process of claim 7, wherein said patterned structure further comprises a layer of insulating material on said layer of titanium silicide.

11. A process of forming a titanium silicide interconnect structure comprising:

providing at least one semiconductor layer;

forming a layer of polysilicon over said at least one semiconductor layer, said layer of polysilicon having a thickness in the range of about 500 Angstroms to about 1500 Angstroms;

forming a layer of titanium silicide over said layer of polysilicon, said layer of titanium silicide having a thickness in the range of about 1000 Angstroms to about 2000 Angstroms;

patterning said layer of titanium silicide and said layer of polysilicon; and forming a layer of titanium nitride on a portion of said layer of titanium silicide by annealing said layer of titanium silicide in the presence of a composition having a reactive nitrogen to thereby form said titanium silicide interconnect structure, said layer of titanium nitride having a thickness in the range of about 50 Angstroms to about 200 Angstroms.

12. A process of forming a field effect transistor having a self-aligned gate, said process comprising:

providing a substrate assembly having at least one semiconductor layer;

forming a source, a drain and said self-aligned gate of said field effect transistor in said at least one semiconductor layer;

forming a patterned interconnect structure for said self-aligned gate, said patterned interconnect structure comprising a layer of polysilicon and a layer of titanium silicide; and nitrifying a portion of said layer of titanium silicide such that a layer of titanium nitride and a titanium silicide interconnect structure are formed.

13. A process of forming a memory array, said memory array comprising a plurality of memory cells arranged in rows and columns, each of said plurality of memory cells comprising at least one field effect transistor, said process comprising:

providing at least one semiconductor layer;

forming sources, drains and gates for each of said field effect transistors over said at least one semiconductor layer;

forming a patterned structure for interconnecting desired gates of each of said field effect transistors and other structures formed as part of said memory array, said patterned structure comprising a layer of polysilicon and a layer of titanium suicide; and nitrifying a portion of said layer of titanium silicide such that a layer of titanium nitride and a titanium silicide interconnect structure are formed.

14. A process of fabricating a wafer comprising:

providing a wafer having a substrate assembly, said substrate assembly having at least one semiconductor layer;

forming a repeating series of sources, drains and gates for at least one field effect transistor on each of a plurality of individual die on said wafer over said at least one semiconductor layer;

forming a patterned interconnect structure for each of said field effect transistors on each of said plurality of individual die on said wafer, said patterned interconnect structure comprising a layer of polysilicon and a layer of titanium silicide; and nitrifying a portion of said layer of titanium silicide such that a layer of titanium nitride and a titanium silicide interconnect structure are formed.

15. The process of claim 1, wherein said layer of polysilicon has a thickness in the range of about 500 Angstroms to about 1500 Angstroms.

16. The process of claim 15, said layer of titanium silicide has a thickness in the range of about 1000 Angstroms to about 2000 Angstroms.

17. A process of forming a titanium silicide structure comprising:

providing at least one semiconductor layer;

forming a layer of polysilicon over said at least one semiconductor layer;

forming a layer of titanium silicide over said layer of polysilicon;

patterning said layer of titanium silicide and said layer of polysilicon; and nitrifying a portion of said layer of titanium silicide such that a layer of titanium nitride is formed.

18. The process of claim 17, wherein said layer of titanium nitride has a thickness in the range of about 50 Angstroms to about 200 Angstroms.

19. The process of claim 18, wherein said layer of titanium nitride has a thickness of approximately 150 Angstroms.

20. The process of claim 15, wherein nitrifying a portion of said layer of titanium silicide such that a layer of titanium nitride is formed comprises nitrifying substantially all of the exposed portions of said layer of titanium silicide such that said layer of titanium nitride is formed on substantially all of said exposed portions of said layer of titanium silicide.

21. The process of claim 15, wherein said layer of polysilicon has a thickness in the range of about 500 Angstroms to about 1500 Angstroms.

22. The process of claim 21, wherein said layer of titanium silicide has a thickness in the range of about 1000 Angstroms to about 2000 Angstroms.

23. A process of forming a gate structure for a field effect transistor having a self-aligned gate, said process comprising:

providing a substrate assembly having at least one semiconductor layer;

forming a source and a drain of said field effect transistor in said at least one semiconductor layer;

forming a patterned structure for said self-aligned gate, said patterned structure comprising a layer of polysilicon and a layer of titanium silicide; and nitrifying a portion of said layer of titanium silicide such that a layer of titanium nitride and a titanium silicide gate structure are formed.

* * * * *

UNITED STATES PATENT AND TRADEMARK OFFICE
CERTIFICATE OF CORRECTION

PATENT NO : 5,960,303
DATED : September 28, 1999
INVENTOR(S) : Christopher W. Hill It is certified that error appears in the above-identified patent and that said Letters Patent is hereby corrected as shown below:

Col. 6, line 49, "suicide" should be --silicide--.
Col. 8, line 21, "suicide" should be --silicide--.

Signed and Sealed this

Sixth Day of June, 2000

Attest:

Q. TODD DICKINSON

*Attesting Officer*      *Director of Patents and Trademarks*